United States Patent
Klein et al.

(10) Patent No.: US 7,126,143 B2
(45) Date of Patent: *Oct. 24, 2006

(54) METHOD AND DEVICE FOR PRODUCING EXTREME ULTRAVIOLET RADIATION AND SOFT X-RAY RADIATION

(75) Inventors: Jürgen Klein, Aachen (DE); Willi Neff, Kelmis (BE); Stefan Seiwart, Aachen (DE); Klaus Bergmann, Herzogenrath (DE); Joseph Pankert, Aachen (DE); Michael Löken, Jülich (DE)

(73) Assignees: Fraunhofer-Gesellschaft zur Förderung der angewandten Forschung e.V., München (DE); Philips Corporate Intellectual Property GmbH, Hamburg (DE); Koninklijke Philips Electronics N.V., Eindhoven (NL)

( * ) Notice: Subject to any disclaimer, the term of this patent is extended or adjusted under 35 U.S.C. 154(b) by 89 days.

This patent is subject to a terminal disclaimer.

(21) Appl. No.: 10/474,121

(22) PCT Filed: Mar. 23, 2002

(86) PCT No.: PCT/DE02/01085

§ 371 (c)(1), (2), (4) Date: Mar. 26, 2004

(87) PCT Pub. No.: WO02/082872

PCT Pub. Date: Oct. 17, 2002

(65) Prior Publication Data

US 2004/0183037 A1 Sep. 23, 2004

(30) Foreign Application Priority Data

Apr. 6, 2001 (DE) .............. 101 17 377
Aug. 11, 2001 (DE) .............. 101 39 677
Oct. 29, 2001 (EP) .............. 01125762

(51) Int. Cl.
G21K 5/02 (2006.01)

(52) U.S. Cl. .............. 250/504 R
(58) Field of Classification Search .............. None
See application file for complete search history.

(56) References Cited

U.S. PATENT DOCUMENTS

| | | | |
|---|---|---|---|
| 4,201,921 A | 5/1980 | McCorkle | 250/493 |
| 4,596,030 A | 6/1986 | Herziger et al. | 378/119 |
| 4,602,376 A | 7/1986 | Doucet et al. | 378/119 |
| 6,389,106 B1 | 5/2002 | Neff et al. | 378/122 |
| 6,414,438 B1 | 7/2002 | Borisov et al. | 315/111 |

(Continued)

Primary Examiner—Jack I. Berman
(74) Attorney, Agent, or Firm—Gudrun E. Huckett

(57) ABSTRACT

A method for generating extreme ultraviolet radiation and soft x-ray radiation with a gas discharge operated on the left branch of the Paschen curve, in particular, for EUV lithography,
wherein a discharge chamber (10) of a predetermined gas pressure and two electrodes (11, 12) are used, wherein the electrodes have an opening (14, 15), respectively, positioned on the same symmetry axis (13) and, in the course of a voltage increase (16) upon reaching a predetermined ignition voltage ($U_z$), generate a plasma (17) located in the area between their openings (14, 15), which plasma is a source of the radiation (17') to be generated,
wherein an ignition of the plasma (17) is realized by affecting the gas pressure and/or by triggering,
and wherein, with the ignition of the plasma (17), an energy storage device supplies by means of the electrodes (11, 12) stored energy into the plasma (17), characterized in that the ignition of the plasma (17) is realized by using a predetermined ignition delay (18).

15 Claims, 11 Drawing Sheets

U.S. PATENT DOCUMENTS 6,452,194 B1 * 9/2002 Bijkerk et al. ........... 250/492.2

6,667,484 B1 * 12/2003 Koshelev et al. ........ 250/492.2

* cited by examiner

METHOD AND DEVICE FOR PRODUCING EXTREME ULTRAVIOLET RADIATION AND SOFT X-RAY RADIATION

BACKGROUND OF THE INVENTION

The invention relates to a method for generating extreme ultraviolet radiation and soft x-ray radiation with a gas discharge operated on the left branch of the Paschen curve, in particular, for EUV lithography, wherein a discharge chamber of a predetermined gas pressure and two electrodes are used, wherein the electrodes have an opening, respectively, positioned on the same symmetry axis and, in the course of a voltage increase upon reaching a predetermined ignition voltage generate a plasma located in the area between their openings, which plasma is a source of the radiation to be generated, wherein an ignition of the plasma is realized by affecting the gas pressure and/or by triggering, and wherein, with the ignition of the plasma, an energy storage device supplies by means of the electrodes stored energy into the plasma.

A method with the aforementioned method steps is known from DE-A-197 53 696. The method is carried out in a device comprising an electrode system forming the discharge chamber. By means of this electrode system, extreme ultraviolet radiation and soft x-ray radiation are generated that can be used, in particular, for EUV lithography. The electrode system is comprised of two electrodes, i.e., a cathode and an anode, each having an opening. The opening is essentially a hole, and both openings are positioned on a common axis of symmetry. The cathode is embodied as a hollow cathode, i.e., it has a cavity. This cavity is used in order to generate the electrical field in a predetermined way. In particular, the arrangement of the electrodes is such that the field lines in the area or the bore holes are sufficiently stretched so that the firing condition of above a certain voltage is fulfilled. The discharge chamber is filled with gas, and the gas pressure, at least in the area of the electrode system, is within the range of 1 Pa to 100 Pa. The geometry of the electrodes and the gas pressure are selected such that the desired ignition of the plasma is realized on the left branch of the Paschen curve and, as a result of this, no dielectric firing between the electrodes outside of the openings occurs. As a result of the ignition, a current-conducting plasma channel of axial-symmetrical shape results in the area of the openings of the electrodes. In addition, current is supplied by means of the energy storage device via this channel. The resulting Lorentz force constricts the plasma. As a result of this constriction effect and because of resistance heating, very high temperatures occur within the plasma and radiation of a very short wavelength is generated. The known device can produce EUV light in the wavelength range of 10–20 nm.

In connection with the method it is important that a switching element between the electrode system and the energy storage device is principally not needed. Accordingly, a low-inductive and effective coupling of the electrically stored energy into the electrode system can be achieved. Poles energies of a few Joules are sufficient in order to trigger current pulses in the range of several kilo ampere up to several 10 kilo ampere. Triggering of the energy coupling into the discharge that is operated in a controlled fashion or by automatic firing is realized by adjustment to a predetermined ignition voltage. The ignition voltage is affected, for example, by the gas composition, the temperature, pre-ionization, electrical field distribution, and other parameters. It can be adjusted according to the Paschen curve by means of the gas pressure of the discharge vessel. The energy storage device must also be charged up to this ignition voltage in order to be able to supply in the case of ignition as much energy as possible into the plasma.

The invention has the object to improve a method comprising the aforementioned method steps such that the radiation yield, i.e., particularly the yield of EUV light, for each pulse is improved as well as the pulse-to-pulse stability of a plurality of sequentially performed discharges that are utilized in the method performed with pulse operation for generating the EUV light.

SUMMARY OF THE INVENTION

The aforementioned object is solved in that the ignition of the plasma is realized by using a predetermined ignition delay.

Carrying out the method with ignition delay results in a prolongation of the generation of the conductive plasma. In this way, an improvement of the cylinder symmetry of the low-impedance starting plasma that is required for discharge is obtained, i.e., of that plasma that is generated in the area of the openings of the electrodes after reaching the ignition voltage. The ignition delay results accordingly in an improvement of the EUV yield/pulse and the pulse-to-pulse stability. In connection with the method in a range of pulse operation of 50 Hz to 500 Hz an increase of the EUV yield by approximately 10 percent has been observed when selecting an ignition delay of approximately 1 ms.

For affecting the ignition delay, the method is carried out such that the ignition delay is reduced by increasing the gas pressure or is increased by reducing the gas pressure. Such changes of the gas pressure can be obtained particularly easily when the gas flows through the area of the electrode system, for example, in order to affect the repetition frequency, i.e, to thereby perform the method with increased pulse frequencies.

In order to affect the ignition delay, the method can be performed such that the ignition is realized by triggering a triggering pulse which is supplied to a triggering electrode affecting the ignition area of the plasma. By the triggering action, the distribution of the charge carriers in the ignition area of the plasma is affected and in this way also the point in time at which the ignition effectively occurs.

It is expedient to carry out the method such that the triggering action for achieving a predetermined ignition delay is carried out in combination with an application of a pressure interval of the gas pressure. In this case, the pressure as well as the point in time of triggering are adjusted because the discharge, even for a triggered operation, can be carried in a stable way, or if at all, only within a certain pressure interval.

In the afore described connection of triggering, the method can be carried out such that triggering is employed together with a predetermined triggering delay. The ignition delay is increased accordingly.

The introduction of stored energy into the discharge that is carried out by automatic firing is realized together with the firing, i.e., automatically with the ignition of the plasma, wherein it should be ensured in this connection that the energy storage device taking into consideration the pulse operation is charged before the ignition is carried out. It is therefore necessary to have available information in regard to the voltage increase and obtaining a predetermined ignition voltage. As a result of this, the method can be carried out such that the voltage increase and/or obtaining a predetermined ignition voltage is determined measuring-technologically and in that affecting the gas pressure and/or the triggering action is realized taking into account the measured results. When the regulating action is performed within the context of continuous control, the gas pressure or a triggering delay is employed as a parameter. In this way, the desired ignition delay can be achieved or monitored measuring-technologically.

It is also possible to carry out the method such that the point in time of ignition is determined measuring-technologically. In this way it is possible to determine the time which elapses between the point of reaching the ignition voltage and the effective point in time of ignition; this time corresponds to the ignition delay.

For performing the measuring-technologically determination of the point in time of ignition, the method can be performed such that the point in time of ignition is measured by means of a measurement of a voltage differential of the electrode voltage and/or by means of a measurement of a current differential of the electrode current. At the beginning of ignition, the voltage supplied to the electrodes changes abruptly and, likewise, the current flowing during discharge. The voltage collapses and the current increases; both can be reliably detected.

The ignition delay can be controlled in that the time between reaching the predetermined ignition voltage and the point in time of ignition is measured and in that the gas pressure is adjusted based on the measured results in order to match the predetermined ignition delay. The time between reaching the predetermined ignition voltage and the point in time of ignition is measured, for example, analog by means of an integrator or digitally by means of a counter. The time is supplied to a governor as a measured parameter; the governor adjust accordingly the gas pressure in the sense of a stabilization of the ignition delay. A series of discharge processes can be averaged, i.e., across a certain number of pulses.

A special method is characterized in that a measuring-technological determination of the voltage present at the electrodes is realized from the beginning of the voltage increase across a certain time interval that includes a presumed point in time of ignition, wherein, for the measuring-technological determination, preferably an ignition voltage integrator is used. The time interval therefore surpasses the duration that is required for the charging process or the voltage increase at the electrodes. As a result of this, information in regard to the ignition voltage and in regard to the ignition delay can be derived from the same signal. The ignition voltage integrator enables a variety of information based on the same measured signal.

Moreover, the method can be modified such that a measuring-technological determination of the voltage present at the electrodes includes saving the reached ignition voltage value up to the point of beginning of the subsequent voltage increase. The saving action is realized, for example, by means of a sample-and-hold circuit.

Expediently, the method can be carried out such that the charge state of the capacitor block connected directly to the electrodes as an energy storage device is monitored continuously during voltage increase and that, after reaching a predetermined ignition voltage, triggering is carried out, as needed with a predetermined triggering delay. Information in regard to the charge state of the capacitor block can be obtained and evaluated with a suitable electronic device. The information is the basis for enabling operation of the method according to the above described strategies wherein influence is exerted on the gas pressure and/or the triggering of a triggering pulse.

In some high-voltage capacitors their capacitance depends greatly on the temperature. In such cases, care must be taken that the energy of the capacitor at the time of ignition is maintained constant. In this connection, it is not important to maintain a constant ignition voltage; instead, the predetermined ignition voltage must be corrected by performing a corrective computation. For such a corrective computation the temperature of the capacitor or the capacitance across the duration of the charge ramp or the supplied charge voltage can be measured in order to carry out a corresponding correction.

A special method is characterized in that triggering is carried out by means of a triggering electrode acting on charge carriers of an intermediate electrode space in that its blocking potential provided relative to a cathode is reduced. In this way, a triggering pulse can be reached at a predetermined point in time in order to influence in this way the ignition delay.

In regard to a high EUV light efficiency, the method can be carried out such that the energy storage device is charged until a predetermined ignition voltage has been reached while forgoing complete recombination of the plasma taking place after extinguishing of the plasma. In this way, especially the repetition frequency can be increased, wherein the energy storage device can be recharged within shorter time intervals.

In this connection, it is also possible to allow a high-impedance plasma to burn between the electrodes in the time period between two plasma discharges provided for generating radiation. The high-impedance plasma results in improved conditions for a starting plasma of high current discharge.

The supply of stored energy into a discharge operated by automatic firing is carried out at the time of firing, i.e., automatically with the ignition of the plasma. However, in this connection it must be taken into consideration that a discharge system without triggering has only a single firing point that is determined by the conditions of the Paschen curve. This point is not stable. When the electrode system is heated in particular within the discharge chamber, the firing will no longer take place at the same voltage.

Moreover, firings will repeat themselves in fast sequence to thus generate radiation constantly. Between two firings the system requires a certain amount of time for recombination of the gas in the discharge chamber. During this time period, the gas returns, at least partially, into its initial state so that the energy storage device can again be recharged and the required voltage can be build up at its electrodes. As a result of this, the state of the system also depends on when the last firing has taken place, i.e., at which repetition frequency the generation of the radiation has been carried out. At a high repetition frequency, the working point positioned on the Paschen curve will be different than for a low repetition frequency. In practice, this means that the repetition frequency can be very limited because no stable working point can be found at all anymore. In connection with this, problems reside in that it is not possible to switch quickly enough from one repetition frequency to another and that even for a certain repetition frequency switching on and off cannot be carried out repeatedly. Switching on and switching off is particularly important when a lithography device is operated where between the exposure processes pauses are mandatory in order to be able to perform adjustments on the device.

The invention therefore has additionally the object to improve a method for generating extreme ultraviolet radiation and soft x-ray radiation with a gas discharge operated on the left branch of the Paschen curve, in particular, for EUV lithography, wherein a discharge chamber of a predetermined gas pressure and two electrodes are used, wherein the electrodes have an opening, respectively, positioned on the same symmetry axis and, in the course of a voltage increase upon reaching a predetermined ignition voltage, generate a plasma located in the area between their openings, which plasma is a source of the radiation to be generated, wherein an ignition of the plasma is realized by triggering, and wherein with the ignition of the plasma an energy storage device supplies by means of the electrodes stored energy into the plasma, such that for a method performed by pulse operation for the generation of the EUV light a precise control of the pulses can be achieved, in particular, within a wide parameter field of the discharge processes, in order to improve in this way the radiation yield of the EUV light in the sense of the afore described object.

This object is solved in that the ignition of the plasma is realized by a triggering electrode whose potential before beginning the triggering process is higher than that of one of the electrodes used as a cathode.

By the triggering action, an influence is exerted onto the ignition conditions for the plasma. In particular, triggering affects the distribution of charge carriers in the ignition area of the plasma and thus also the point in time at which the ignition will effectively occur. In this connection, the potential of the triggering electrode before the beginning of the triggering process is higher than that of the cathode. As a result of this, an effect on the field generation in the discharge chamber is realized in such a way that no firing can occur. Firing is possible only when the potential that prevents firing is removed.

In a special way, the method is carried out such that a voltage of the triggering electrode relative to the electrode that is used as a cathode, the voltage on both electrodes, and the gas pressure of the discharge chamber are adjusted such that upon supplying the triggering voltage ignition of the plasma will not occur and will occur only after switching off the triggering voltage. Switching off the triggering voltage enables such a generation of the electrical field in the discharge chamber that the firing conditions are fulfilled. The point in time of firing can be precisely determined by the triggering signal, i.e., by switching off the triggering voltage. It is important in this connection that the parameter range for a discharge can be significantly broadened. The pressure in the gas chamber, the spacing of the electrodes, and the voltage at the electrodes can be selected differently as a function of the triggering voltage. While the firing in the un-triggered case is determined only by a single point on the Paschen curve, in the triggered case large voltage ranges $\Delta U$ or pressure ranges $\Delta P$ can be determined in which, after the triggering pulse, firing occurs.

It is possible to adjust the parameters such that the method is operated with repetition frequencies between >0 Hz and 100 kHz. Good results were found for repetition frequencies of 10 kHz.

Moreover, it is possible to perform the method such that it is operated with long operating intervals that are adjustable by switching on and off; during the intervals a fixed repetition frequency is used. An operating interval begins with switching on and ends with switching off. During an operating interval, for example, one wafer is exposed in a partial area. The radiation which is responsible for exposure is carried out according to one of the above described methods, in particular, at a fixed repetition frequency. After completion of an operating interval, an adjustment of the exposure device and/or of the wafer can be realized in order to then repeat, after exposure of the same wafer or of a different wafer, the described method with a predetermined repetition frequency.

The invention relates also to a device for generating extreme ultraviolet radiation and soft x-ray radiation with a gas discharge operated on the left branch of the Paschen curve, comprising a discharge chamber of a predetermined gas pressure and two electrodes, wherein the electrodes have an opening, respectively, positioned on the same symmetry axis and, in the course of a voltage increase upon reaching a predetermined ignition voltage generate a plasma located in the area between their openings, which plasma is a source of the radiation to be generated, comprising a triggering electrode in the space adjoining the first electrode for triggering an ignition of the plasma, in particular for performing the method described above. Such a device is to be improved in particular for performing the above described methods such that a high service life and excellent cooling action of the electrodes is ensured. The above described object is solved in that the triggering electrode is embodied as a wall which has at least over surface area portions thereof has a predetermined spacing from the opening of the first electrode. The configuration of the triggering electrode as a wall ensures also in the case of a temperature-caused and plasma-caused wear of material a long durability and its large surfaces can be cooled easily, which, in turn, is beneficial with regard to a long service life. At the same time, the arrangement of the triggering electrode at a predetermined spacing from the opening of the first electrode ensures that the shape of the electrical field required for the field generation is ensured by means of the first electrode.

In the above sense it is advantageous to configure the device such that the first electrode is a hollow electrode and that the triggering electrode is a wall or wall section within the geometry of this hollow electrode. This provides a corresponding simplification of the electrode configuration.

When the triggering electrode is configured as a back wall that is parallel to the hollow electrode and positioned opposite its opening, the simplification of the electrode configuration is particularly enhanced. In particular, with regard to the symmetry axis of the bores of the electrode symmetrical configurations of the electrode systems can be achieved.

It is preferred that the triggering electrode has a through opening arranged on the symmetry axis. In this way, it can be prevented that particle radiation that occurs upon discharge and the connected pulsed currents of typically a few 10 ampere can flow undesirably via the triggering electrode to the electronic triggering device.

For the configuration of a hollow electrode it is advantageous to configure the device such that the triggering electrode is cup-shaped and that a cup axis extending perpendicularly to the cup bottom coincides with the symmetry axis of the electrodes.

A simplified configuration results when the triggering electrode is mounted by means of an insulating device on the first electrode. The insulating device makes it possible that the first electrode, on the one hand, and the triggering electrode, on the other hand, are maintained at different electrical potentials.

The afore describe configuration of the device can be specified in that the first electrode has an annular collar that is concentric to its opening and adjoins the triggering electrode while overlapping the insulator or engages an annular recess of the triggering electrode while maintaining a potential-separating spacing in each case. In this way, vapor deposition and short-circuiting of the insulator can be prevented.

The invention relates also to a device for generating extreme ultraviolet radiation and soft x-ray radiation with a gas discharge operated on the left branch of the Paschen curve, comprising a discharge chamber of a predetermined gas pressure and two electrodes, wherein the electrodes have an opening, respectively, positioned on the same symmetry axis and, in the course of a voltage increase upon reaching a predetermined ignition voltage, generate a plasma located in the area between their openings, which plasma is a source of the radiation to be generated, comprising a triggering electrode in the space adjoining the first electrode for triggering an ignition of the plasma, and comprising an energy storage device for supplying stored energy into the plasma via the electrodes, in particular for performing the afore described method. In such a device ionization can occur in the discharge chamber. The movable ions located in the electrical field impact on the triggering electrode and have generally a sufficiently great energy in order to knock secondary electrons out of the metallic surface of the electrodes. These electrons reach the anode because of the potential difference. As a result of this, between the anode and the triggering electrode a conducting channel can be formed without the desired firing having already occurred in the area of the openings of the electrodes. In this connection, a noticeable proportion of the energy storage device can be discharged by means of the triggering circuit; this entails the risk of destruction of such a circuit.

Moreover, a problem can be caused in that the potential of the triggering electrode, as a result of the formation of a conducting channel, drops to the level of the anode so that relative to the cathode a higher voltage is generated. As a result of this, undesirable discharges between the cathode and the triggering electrode can occur which can also have a disruptive effect on the proper function of the device.

Finally, an ion or particle beam can lead to at least a portion of the cathode being vaporized as a result of its high energy. This results in an undesirable wear and in deposits of vaporized particles on the surrounding surfaces.

In contrast to this, the invention has the object to configure a device having the aforementioned features such that a high service life without disruptions of its function can be obtained.

The aforementioned object is solved in that the triggering electrode is arranged outside of a particle beam being formed on the symmetry axis or has to shielding preventing the latter. When the triggering electrode is arranged outside of the particle beam forming along the symmetry axis, the particles or ions accelerated on this axis no longer impact on the triggering electrode. The afore described malfunctions are at least significantly reduced. The same holds true when the triggering electrode has a shielding which prevents the generation of a conducting channel between the triggering electrode and the anode.

An advantageous configuration of the device is characterized in that the triggering electrode is arranged on the symmetry axis of the openings of the electrodes and in that an end face facing the openings is provided with an insulator as a shielding at least in the formation area of the particle beam. The arrangement of the triggering electrode on the symmetry axis can be such that a uniform influence on the field lines in the discharge chamber is safely achieved. The insulator provides the desired protection for the triggering electrode without distorting the field lines in the discharge chamber in a significant way.

It is advantageous when the insulator is in the form of a layer that is applied onto the end face of the triggering electrode. The triggering electrode in this case is protected sufficiently with a minimal material expenditure.

The device can also be configured such that the insulator is formed as a member that is sunk into the end face of the triggering electrode. In this case, the triggering electrode and the insulator are to be assembled with conventional mechanical manufacturing means.

An advantageous configuration of the device can be characterized in that the insulator has a recess with a cross-section matched to that of the particle beam. A particle beam, in this case, can impact on the bottom of the recess. The resulting vaporization products deposit therefore mainly on the inner walls of the recess and therefore hardly disturb the other surfaces of the arrangement.

When the recess of the insulator tapers conically, the energy of an ion beam is distributed onto a larger surface area and, in this way, the local thermal heating is reduced. Correspondingly fewer vaporization products are formed.

A further possibility reside in configuring the device such that the triggering electrode is insulated completely eat least relative to the space which adjoins the first electrode. The manufacture of the triggering electrode for such a device can be influenced advantageously by a complete insulation or coating. Also, inhomogeneities in regard to the field formation or discharge formation on the metal surfaces of the triggering electrode in the transition area between insulated and non-insulated metal surfaces are eliminated.

A disadvantage of a complete installation of the triggering electrode can be that under certain discharge conditions electrical charges will collect on the insulated surface and can effect shielding of the triggering potential. In order to prevent this, the device can be configured such that the shielding of the triggering electrode has a residual conductivity that dissipates surface charges but prevents a discharge-affecting current flow between the second electrode and the triggering electrode. In this case of a shielding that dissipates surface charges, it is advantageous to insulate the triggering electrode completely in order to prevent additional dissipation paths.

When the triggering electrode is not to be positioned on the symmetry axis, it is preferred to configure the device such that the triggering electrode is a hollow cylinder surrounding the symmetry axis.

In particular, the device can be configured such that a hollow-cylindrical triggering electrode has a bottom facing away from the two electrodes wherein the bottom is configured as an insulator or has a metal bottom that is connected to the potential of one of the electrodes and, for this purpose, is insulated relative to the triggering electrode. The insulator can then take over the functions of the afore described insulators, in particular, relative to a possible particle beam. When the bottom is a metal bottom, it can either be connected to the potential of the anode so that a conducting channel cannot result because of identical potentials; however, the metal bottom can also be connected to the potential of the cathode in order to remove produced charge carriers.

Moreover, it is advantageous to configure the device such that the triggering electrode is an annular plate or at least an electrode pin which is/are mounted transversely to the symmetry axis of the electrodes in the first electrode. With the annular plate or with the electrode pin, the electrical field can be affected in the discharge chamber or in the space adjoining the triggering electrode in order to influence the discharge behavior of the device. In order to reach the afore described goal, the triggering electrode is mounted in an insulated way within the first electrode.

The device is exposed during its function to significant heat development. It is therefore expedient to configure it such that the shielding is comprised of temperature-resistant insulation material.

Because of the described heat development, it is also expedient to connect the shielding with the triggering electrode in a thermally well conducting way in order to dissipate heat.

In order to intercept the predominant portion of the charge carriers that reached the shielding the area of the symmetry axis, the device is expediently configured such that the shielding has a diameter that corresponds at least to the diameter of the openings.

BRIEF DESCRIPTION OF THE DRAWINGS

The invention will be explained with the aid of a drawing. It is shown in.

DESCRIPTION OF PREFERRED EMBODIMENTS

Figure 1:
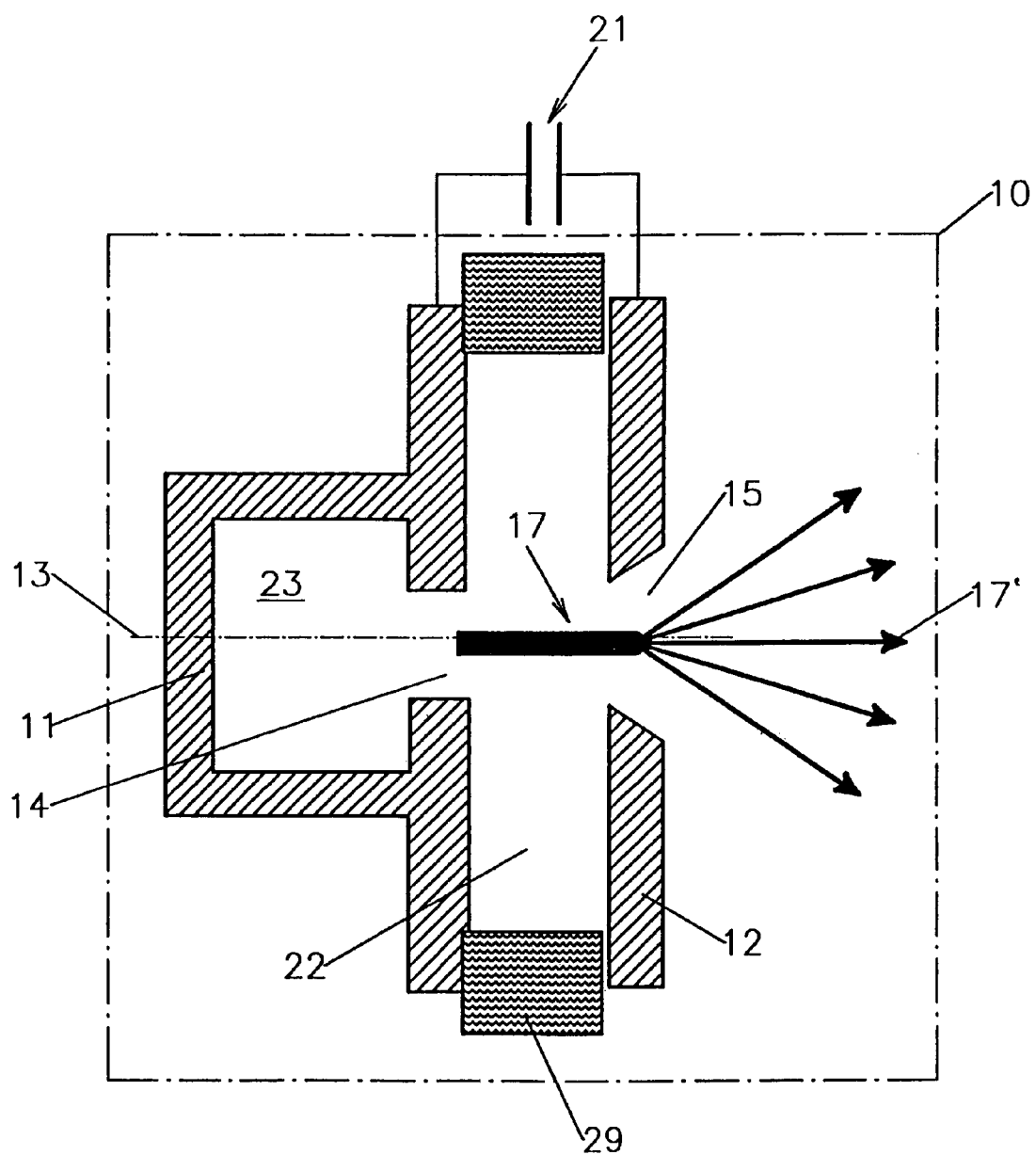
FIG. 1 a schematic illustration of an electrode system.

FIG. 1 shows schematically the configuration of an electrode system arranged in a discharge chamber 10. The discharge chamber 10 is filled with a gas of a predetermined gas pressure and can be formed by suitably configured electrodes of the electrode system itself. The gas pressure is adjustable. The devices of the discharge vessel for adjusting the gas pressure and a configuration of the electrode system matched thereto is present but is not illustrated.

Two electrodes 11, 12 are present. The electrode 12 is configured as an anode with a central opening 15 which conically widens starting at an intermediate electrode space 22.

The electrode 11 is a cathode, in particular, a hollow cathode with a cavity 23 that is connected by means of an opening 14 of the cathode to the intermediate electrode space 22. The openings 14, 15 are aligned with one another and define an axis of symmetry 13 of the electrode system. The electrodes 11, 12 are insulated relative to one another. An insulator 29 serving for this purpose determines the electrode spacing.

As a result of the described configuration, the electrode system is enabled to form field lines upon supplying an electrical high voltage in the range of, for example, several 10 kV, wherein the field lines, at least in the area of the intermediate electrode space 22, are straight and parallel to the axis of symmetry 13. When the voltage is increased starting from a predetermined low value in a pulsed fashion, there results a charge ramp or voltage increase 16 according to FIGS. 2, 3. Ionization processes occur that, as a result of the field strength conditions, are concentrated in the intermediate electrode space 22. For this purpose, the voltage increase 16 and the gas pressure are adjusted relative to one another such that, because of the ionization, a gas discharge on the left branch of the Paschen curve results where a plasma channel or its plasma is not generated by means of a single short-term electrode avalanche but in several steps by means of secondary ionization processes. As a result of this, the plasma distribution already in the starting phase is highly cylindrically symmetrical, as is illustrated in the schematic illustration of the plasma in FIG. 1. The resulting plasma 17 is a source for the radiation 17' to be generated.

It is understood that an ignition of the plasma 17 is possible only when an ignition voltage $U_z$ has been reached. According to the invention, it is provided that an ignition delay 18 occurs. As a result of this, the point in time of ignition $t_z$ despite the presence of the ignition voltage $U_z$ is correspondingly delayed. The magnitude of the ignition delay 18 is regulated by controlling the gas pressure. The magnitude of the ignition delay is within typical durations in the range of several microseconds up to a few milliseconds. The ignition delay results in a prolongation of the generation of the conductive plasma. In this way, an improvement of the cylinder symmetry of the plasma 17 is achieved.

The plasma which is formed after the ignition delay can be referred to as a starting plasma. It can serve for energy introduction from an energy storage device during automatic firing operation. FIG. 1 shows the capacitor block 21 as an energy storage device; upon reaching the predetermined ignition voltage and ignition delay the energy storage device will discharge and, in this way, enables the introduction of current pulses within a two-digit kilo ampere range into the plasma. The resulting Lorentz forces of the magnetic field constrict the plasma so that a high luminance results and, in particular, extreme ultraviolet radiation and soft x-ray radiation are generated which in particular have the required wavelength for EUV lithography.

Figure 3:
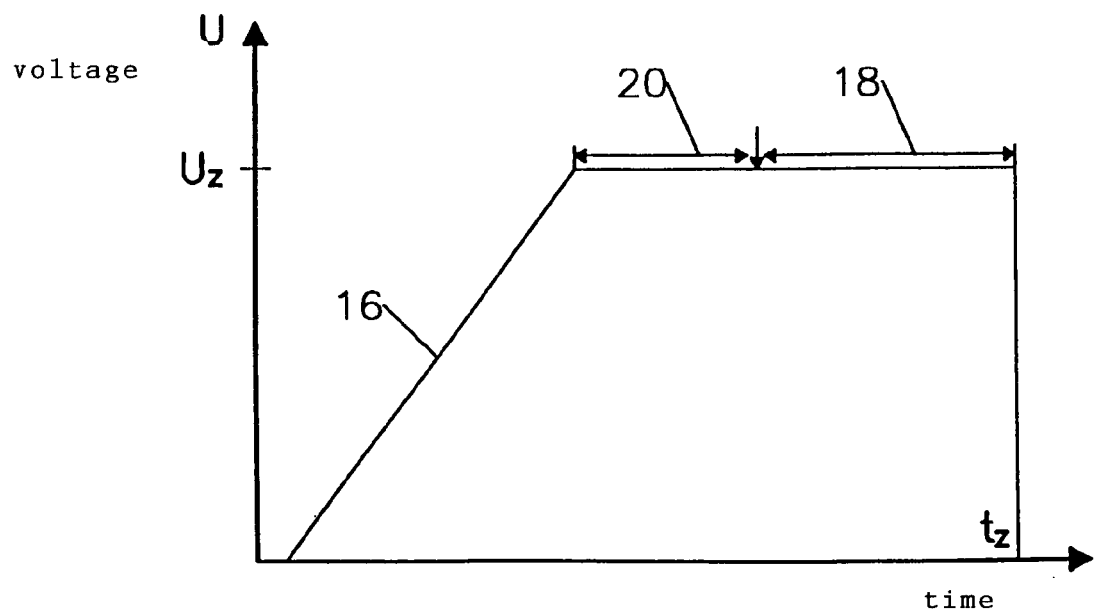
Figure 4:
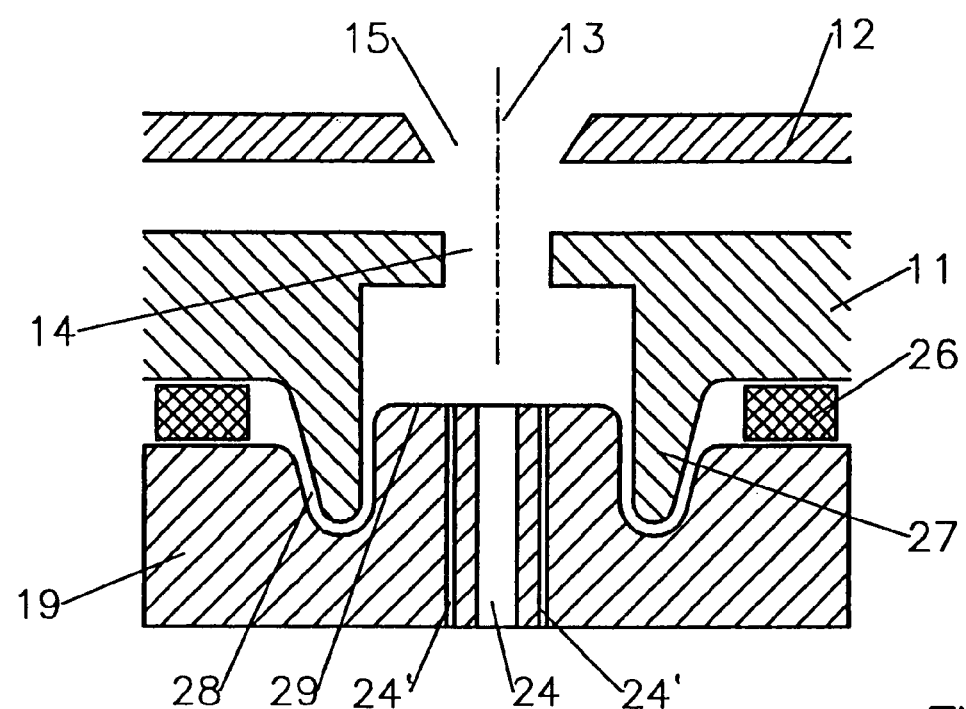
FIG. 4 FIG. 5 differently embodied electrode configurations.
Figure 5:
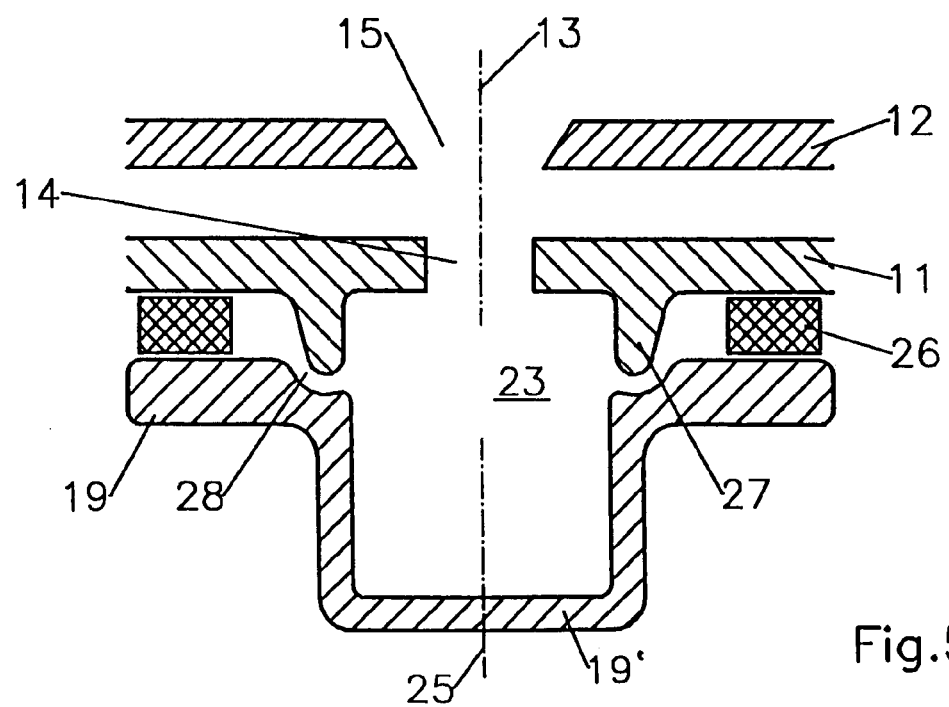

Instead of influencing the ignition delay 18 by means of the gas pressure, in addition a triggering electrode can be used for affecting the ignition delay. By means of a triggering electrode 19 it can be achieved that, despite reaching a predetermined ignition voltage $U_z$, a firing for discharge between the electrode 11, 12 will not yet take place. A triggering delay 20, achievable with the triggering electrode 19 according to FIGS. 4, 5, is illustrated in FIG. 3. It is added to the ignition delay 18. Affecting the total ignition delay by means of a triggering delay 20 is particularly advantageous because it is possible to employ measuring technology in order to reach the precise point in time of ignition $t_z$. This holds true for the case where the gas discharge operation is carried out with automated firing as well as where a switching element between the electrode system and the capacitor block is used. The switching element makes it possible to supply a voltage to the electrode system which is greater than the ignition voltage $U_z$ required for the automatic firing operation. In the latter case, it is possible to work at higher gas pressures; this results in higher intensities of the emitted radiation.

It is expedient to measure the ignition point, in particular, when by means of the, charge device a higher voltage is allowed at the electrode system than their predetermined ignition voltage. The voltage which is connected to the electrode system, i.e., the course of a voltage increase 16, can be detected, for example, by determining the temporal change of the voltage supplied to the electrodes 11, 12. Accordingly, a dU/dt measurement is carried out. It is also possible to carry out a dI/dt measurement, i.e., detection of the temporal change of the discharge current. Current and voltage change suddenly upon reaching the ignition point $t_z$. The time between reaching the predetermined ignition voltage $U_z$ and the point in time of ignition can be measured, for example, in an analog fashion by means of an integrator or digitally by means of a counter. This time is supplied as a measured value to a controller which affects accordingly the gas pressure in the sense of stabilization of the ignition delay 18. This holds true also for the situation of application of a triggering delay 20.

The measurement can be performed, for example, by means of an ignition voltage integrator which takes over processing of the measured value high voltage or voltage at the electrode system or the capacitor block which processing is upstream of the actual controller. In this connection, the ignition voltage integrator integrates the high-voltage supply to the electrodes 11, 12 that is divided down and registers their final value by means of a sample-and-hold until the next charge process. The integration process begins with the charging process, i.e., with the increase of the electrical voltage supplied to the electrodes 11, 12 and is continued for a duration that is determined by a timer. This duration is generally longer than the actual charging process so that in this way also the desired information with regard to the magnitude of the ignition delay can be determined. Additional non-linear members such as, for example, square-root law transfer elements, can be used in order to improve the transmission characteristic line. In this way, information with regard to the ignition delay are obtained as well as with regard to the ignition voltage, and this with the same measured signal. In contrast to a peak detector that determines the ignition voltage, the method is entirely unsusceptible with regard to disturbance peaks that can result, for example, from high-voltage generators. An electronic device is not required for the ignition point detection.

If the method is carried out without triggering electrode, the ignition point $t_z$ can be determined only via the magnitude of the gas pressure. In a method with triggering electrode the afore described triggering delay can be used in order to determine the point of ignition, if needed, in combination with a selection of a suitable gas pressure. In this way, the charge state of the capacitor block 21 is determined by means of an electronic evaluation device, for example, by means of the above described ignition voltage integrator. Triggering by means of the triggering electrode results in that, despite reaching the ignition voltage $U_z$ a plasma deformation causing the discharge of the capacitor block 21 will not yet take place. Only in the case of triggering ignition occurs, i.e., in the case of triggering a triggering pulse after the predetermined triggering delay 20. The controlling parameter can be also the gas pressure which, for example, is adjusted by means of an electronic inlet valve. When the maintenance voltage is not reached after a predetermined reading time, the gas pressure must be reduced. In the other situation, the gas pressure, when ignition does not occur, must be increased after the triggering pulse. A control parameter in this method employing a triggering electrode is in the end the ignition delay, i.e., the time between triggering the triggering pulse and the voltage collapse. The pressure is then adjusted such that the ignition delay is maintained constant within certain tolerances.

The triggering delay 20 indicated in FIG. 3 is provided in an exemplary fashion relative to the point in time of reaching the predetermined ignition voltage $U_z$. In principle, any point in time can be selected prior to this and can be determined by a suitable electronic device; for example, the beginning of the charging process or reaching of a predetermined value of the charge voltage can be selected.

In FIGS. 4, 5, for example, configurations of triggering electrodes are illustrated.

The triggering electrodes 19 are adjacent to the cathode 11 on the side of the cathode facing away from the anode 12. In the illustrated embodiments, they are assembled by means of an insulator 26 together with the cathode 11, wherein means for holding together the electrode 11, the insulator 26, and the triggering electrode 19 are not illustrated.

All embodiments of the triggering electrode have in common that, relative to the symmetry axis 13, they are symmetrically arranged. All embodiments have an axis that is aligned with the symmetry axis 13. In this connection, the triggering electrode 19 is configured as a wall or wall section. It is positioned at a predetermined spacing away from the opening 14 of the electrode 11. In this way, it can be achieved at the same time that the electrode 11 is configured as a hollow electrode, for example, as a hollow cathode. The triggering electrode 19 then forms essentially the back wall of the cathode. Such a back wall is the wall 29 in the embodiment of FIG. 4 and a cup bottom 19' of the cup-shaped triggering electrode 19 in the embodiment of FIG. 5.

The cup-shaped configuration of the triggering electrode 19 shows that it cannot only be the back wall of the electrode 11 but also the sidewall of the space 23 of this hollow electrode that is to be enclosed. It is also conceivable that the triggering electrode 19 is exclusively a sidewall section of an electrode 11 which is connected, by the way, to the electrode potential or the cathode potential.

FIG. 4 illustrates that the triggering electrode 19 is provided with a through opening 24 which serves for passage of the particle beams that form in accordance with the electrode configuration primarily in the area of the symmetry axis. With such a penetration opening, loading of the electronic triggering device can be maintained within acceptable limits. The particle beams are received by the parts of the electrode system which are connected to the potential of the cathode. A through opening 24 can also be used in the case of FIG. 5.

In FIG. 4, bores 24' that are parallel to the through opening 24 are provided. The bores 24' can be gas bores, i.e., for passage of gas in the sense of a gas inlet. The through opening 24 can also be used in the sense of such a gas passage or in the sense of a gas inlet. Both is particularly advantageous when the electrode system itself forms the discharge chamber 10.

In the case of gas discharge projecting into the space 23, vapor deposition on the insulator 26 with metal vapor is to be expected. This could lead to shortcircuiting of the insulator 26. In order to shielding it against the occurring metal vapor, the electrode 11 is provided with an annular collar 27 which is arranged concentrically to the opening 14 and which overlaps the torus-shaped insulator 26. Moreover, the triggering electrode 19 is provided with an annular recess 28. The annular collar 27 engages the annular recess 28. In this way, a potential separating spacing is provided which, however, must be only small because of the usually minimal potential differences between the cathode 11 and the triggering electrode 19.

The triggering electrodes according to FIGS. 4, 5 are possible also in connection with a hollow anode. In this case, the light of the plasma 17 would have to be decoupled from the electrode 11 or from the hollow cathode. However, it is advantageous to decouple the light at the anode, as illustrated in FIG. 1, and to operate the cathode with negative high voltage because, in this way, debris from sputtering and high frequency discharges are prevented better in the part of the electrode system facing an observer.

The potential of the triggering electrode 19 is selected before triggering a triggering pulse and thus before triggering a low-impedance plasma discharge such that the charge carriers are removed from the hollow electrode or hollow cathode and the intermediate electrode space in the bore hole area. This is realized, for example, by supplying to the triggering electrode 19 a positive voltage of typically several 100 V relative to the cathode potential. A triggering pulse is triggered when the potential of the triggering electrode is reduced to that of the cathode or in that a negative potential is supplied to the triggering electrode 19. Typical constant time values for a change of the potential of the triggering electrode 19 are advantageously in the range of a few nanoseconds up to several 100 ns.

In order to obtain high light efficiencies, it is desired to enable a repetition frequency of the discharges that is as high as possible, i.e., in the range of several kHz and preferably above 10 kHz. In this connection, the required resolidification or recombination times of the plasma set limits. These limits depend on the type of gas with which the method is operated. With regard to a high radiation efficiency in the EUV field, the application of xenon is of particular interest. When operating with pure xenon, the repetition frequencies above approximately 1 kHz for typical pulse energies in the range of 1 Joule up to 10 Joule in operation with automatic firing can hardly be reached. It is therefore desirable to perform measures for accelerating the resolidification.

As one possibility the admixture of gases should be mentioned. A fast recombination of the plasma after discharge of the capacitor block can be achieved by admixing gases, for example, air, synthetic air, nitrogen, oxygen, or halogens.

Moreover, the transport of charged particles away from the area of the openings 14, 15 can be enhanced by suitable gas flow. A flow with gas inlet via the cathode and/or via the intermediate electrode space and with gas evacuation via the anode, which according to FIG. 1 is the electrode facing the observer, is advantageous. With such a gas flow a pressure drop in the area of the anode or in the area of a hollow anode can be produced. By means of such pressure gradients it is possible to move the plasma 17 in order to achieve an increased transmission for the EUV radiation in the observation path up to the user.

Further measures for increasing the repetition frequency can be performed in connection with the capacitor block 21. This is based on that the generation of the low-impedance plasma, depending on the conditions, takes up to several 100 microseconds. The capacitor block 21 can now be charged faster than the generation time of the low-impedance plasma. As a result of this, a complete recombination of the plasma can be forgone. It is moreover also possible to allow a high-impedance plasma to burn between two discharges in the area of the openings 14, 15; this results in better conditions for a starting plasma of the high current discharge.

Figure 6:
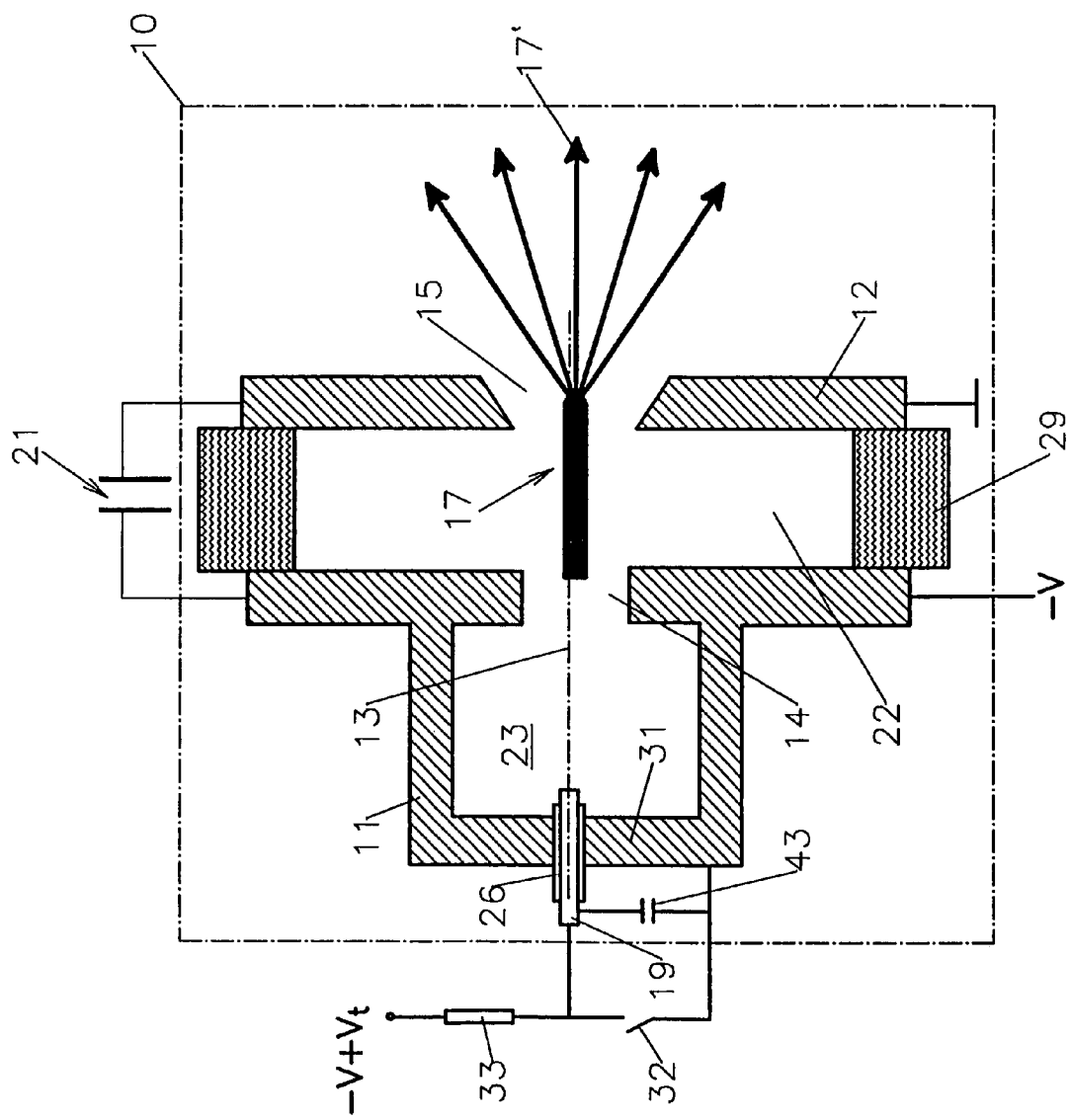
FIG. 6 a schematic illustration of an electrode system, similar to FIG. 1.

FIG. 6 shows schematically the configuration of an electrode system arranged within the discharge chamber 10. The discharge chamber 10 is filled with a gas having a predetermined gas pressure and can be formed by suitably designed electrodes of the electrode system itself. The gas pressure is adjustable. The devices for adjusting the gas pressure of the discharge vessel 10 and a configuration of the electrode system matched thereto are present but not illustrated.

Two electrodes 11, 12 are present. The electrode 12 is an anode with a central opening 15 and widens conically starting at an intermediate electrode space 22.

The electrode 11 is a cathode and is embodied as a hollow cathode with a cavity 23 connected by means of the opening 14 of the cathode to the intermediate electrode space 22. The openings 14, 15 are aligned and together form a symmetry axis 13 of the electrode system. The electrodes 11, 12 are insulated relative to one another. An insulator 29 serving for this purpose determines the electrode spacing.

The electrode system is enabled as a result of the afore describe configuration to generate filed lines upon supplying an electrical high voltage in the range of, for example, several 10 kV; the field lines extended at least in the area of the intermediate electrode space 22 in straight lines in parallel to the axis of symmetry 13. When the voltage is increased starting from a predetermined low value in a pulsed fashion, a charge ramp or voltage increase results. This causes ionization processes which are concentrated because of the field strength conditions within the intermediate electrode space 22. For this purpose, the voltage increase and the gas pressure are adjusted relative to one another such that as a result of the ionization gas discharge on the left branch of the Paschen curve will result, wherein a plasma channel or its plasma is not generated by a single short-time electrode avalanche but in several steps by means of secondary ionization processes. As a result of this, the plasma distribution already in the starting phase is highly cylindrical-symmetrical, as schematically illustrated in FIG. 6. The generated plasma 17 is a source of the radiation 17', an electron radiation, that is to be generated.

The generated plasma can be referred to as a starting plasma. It can serve for energy coupling from an energy storage device for automatic firing operation. FIG. 6 shows a capacitor block 21 as an energy storage device which discharges after reaching the predetermined ignition voltage and, in this way, enables a supply of current pulses within a two-digit kilo ampere range into the plasma. The Lorentz forces of the magnetic field which are formed accordingly constrict the plasma so that a high light efficiency results and, in particular, extreme ultraviolet radiation and soft x-ray radiation are is generated having, in particular, the required wavelength for EUV lithography.

The electrode system illustrated in FIG. 6 is provided with a triggering device in the area of the electrode 11. For this purpose, the electrode 11 has a triggering electrode 19 on the symmetry axis 13 that is secured by an insulator 26 in the bottom 30 of the electrode 11. The insulator 26 serves for providing a potential to the triggering electrode 19 that is different from that of the electrode 11. In this connection, the triggering electrode 19 has a parasite capacitance 31 relative to the electrode 11, measured parallel to a switch 32 with which both electrodes 19, 11 can be connected to the same potential.

Conventionally, the electrode 12 is configured as an anode and is grounded, as illustrated. In contrast, the cathode is connected to a negative potential $-V$ while the triggering electron 19 is connected to a potential $-V+V_t$. The potential of the triggering electrode before beginning the triggering process is thus somewhat higher than that of the electrode 11. For the purpose of triggering, a triggering pulse is triggered by closing the switch 32, and the potential of the triggering electrode 19 is dropped to that of the electrode 11. Typical constant time values for a change of the potential of the triggering electrode 19 are advantageously in the range of a few nanoseconds s up to several hundred nanoseconds.

The electrode arrangement schematically illustrated in FIG. 6 is typically configured such that between the electrodes 11, 12 a spacing of 1 to 10 mm is present. The smallest passage of the openings 14, 15 is typically 1 to 10 mm. The volume of the space 23 in the electrode 11 configured as a hollow cathode is typically 1 to 10 ccm. The gas pressure is between 0.01 and 1 mbar. The electrode voltage is typically 3 to 30 kV, and the potential difference between the triggering electrode 19 and the electrode 11 is between 50 V and 1,000 V.

Figure 7:
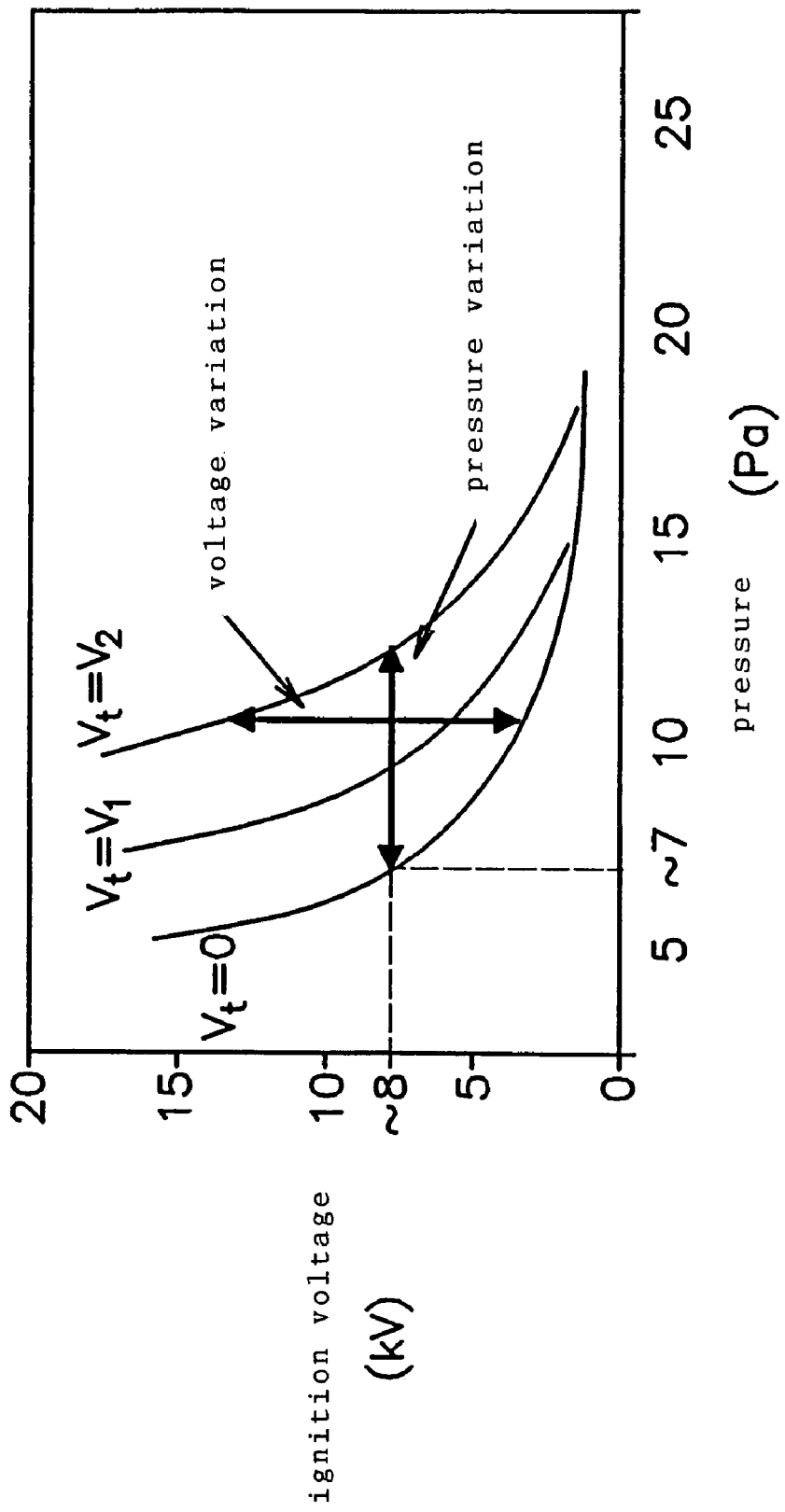
FIG. 7 a diagram-like illustration of the dependency of the ignition voltage of an electrode system from the pressure in a discharge chamber.

Principally, the ignition voltage at which firing between the electrodes 11, 12 occurs and the pressure depend form one another in accordance with the curve illustrated in FIG. 7. FIG. 7 relates to the left branch of the Paschen curve.

Figure 2:
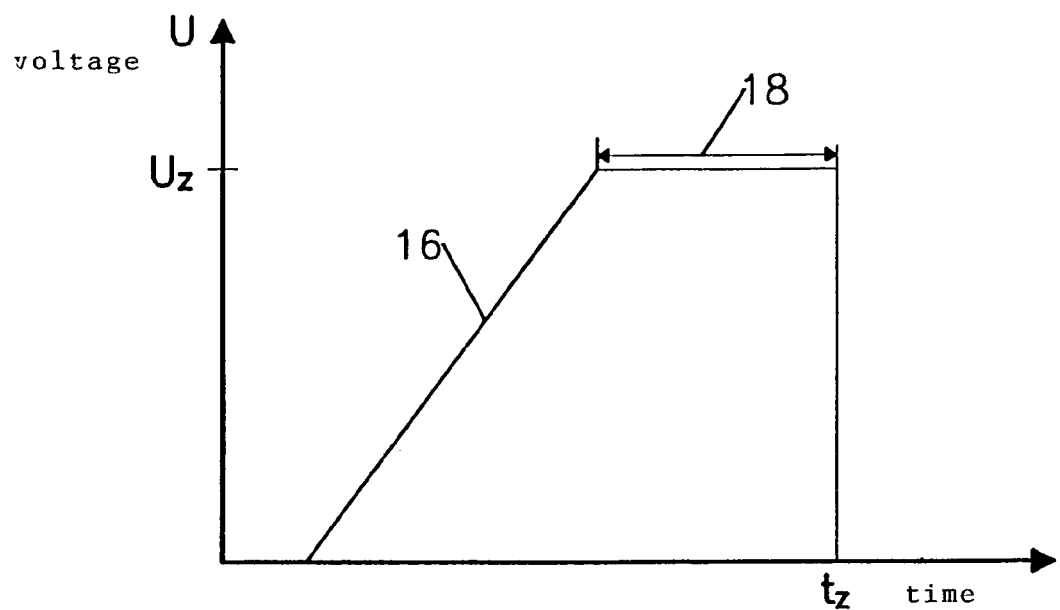
FIG. 2 FIG. 3 diagrammatic illustrations of the voltage course at the electrodes of the electrode system for an ignition process of a plasma during pulse operations.

The left curve of FIG. 7 applies to the operation of un-triggered device. On this curve for V=0 6 there exists only a single firing point which is, for example, provided at a gas pressure of 7 Pa at approximately 8 kV. Other pressures in the space 23 have correspondingly different ignition voltages. The triggering voltage, i.e., the potential difference between the triggering electrode 19 and the electrode 1 can however also deviate from 0. In this case, $V_t$ is not equal 0 but, for example, equal $V_1$ or $V_2$. As a result of this, with the suitable value of the triggering voltage $V_t$ it can be achieved that the device can be operated with different parameters. For a predetermined voltage at the electrodes 11, 12 there is the possibility of pressure variations as illustrated in FIG. 7. In a similar way, for a certain pressure the voltage variations illustrated in FIG. 2 are possible. Correspondingly, also the point in time of firing can be determined precisely by means of the triggering signal without reaching a working area where the above described difficulties would occur. In particular, repetition frequency can be ensured as they are required for the necessary use, for example, in the range of 10 to 22 Hz. Also, operating intervals for certain fixed repetition frequencies are possible so that between the operating intervals the energy essentially required for generating the desired radiation can be saved. The stability of the working point is significantly improved.

Triggering is achieved by the circuit illustrated in FIG. 6. The capacitor block 21 is charged in that the electrode 11 is connected to negative voltage while the electrode 12 is grounded. The connection of the two electrodes 11, 12 is realized by a low-inductive circuit via the capacitor block 21. A high-impedance circuit connects the triggering electrode 19 with the electrode 11 wherein the connection can be opened by the switch 32. In the open situation, a potential difference $V_t$ relative to the electrode 11 is present at the triggering electrode 19. For this case, the voltages at the electrodes 11, 12 as well as the gas pressure of the intermediate electrode space or chamber 23 of the electrode 11 are adjusted such that upon supplying a triggering voltage $V_t$ an ignition of the plasma 17 cannot take place. When the switch 32 is however closed, the potential difference $V_t$ is eliminated and the triggering electrode 19 is supplied with the potential of the electrode 11; a protective resistor 33 protects the voltage source of the triggering voltage.

When the switch 32 is open, it is however possible that between the triggering electrode 19 of FIG. 6 and the electrode 12, serving as an anode, a conducting channel with a corresponding particle beam is formed which discharges the energy of the capacitor block 21 and can also cause damage of the triggering circuit. In FIGS. 8 through 18 differently configured triggering electrodes in a schematically illustrated system of main electrodes 11, 12 are illustrated which can contribute to proper functioning of the device.

FIGS. 8 to 18 show triggering electrodes 19 arranged coaxially to the symmetry axis 13 defined by the electrodes 11, 12 or their openings 14, 15. In this connection, the triggering electrodes 19 of FIGS. 8 through 13 are configured such that they have an end face 34 facing the opening 14. At least this end face 34 is provided with a shielding 35 that is designed differently, respectively. Each shielding 35 is at least so large that it matches the diameter of the openings 14, 15. The shielding 35 is thus present in the vicinity of the triggering electrode 19 in the generation area of the particle beam.

Figure 9:
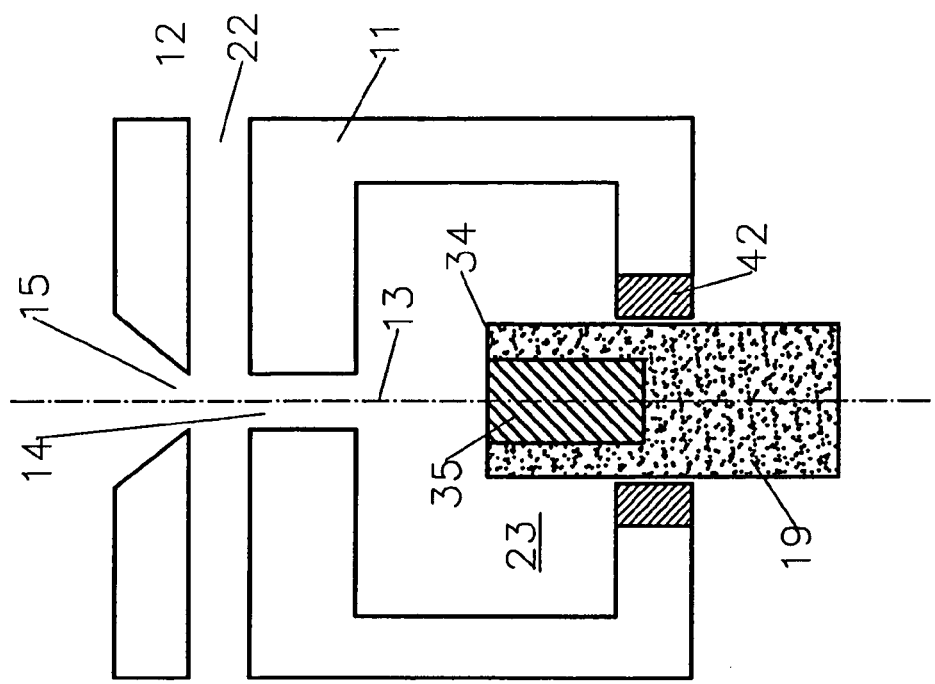
FIG. 8 through 18 schematic illustrations of the electrode systems with differently configured triggering devices.
Figure 8:
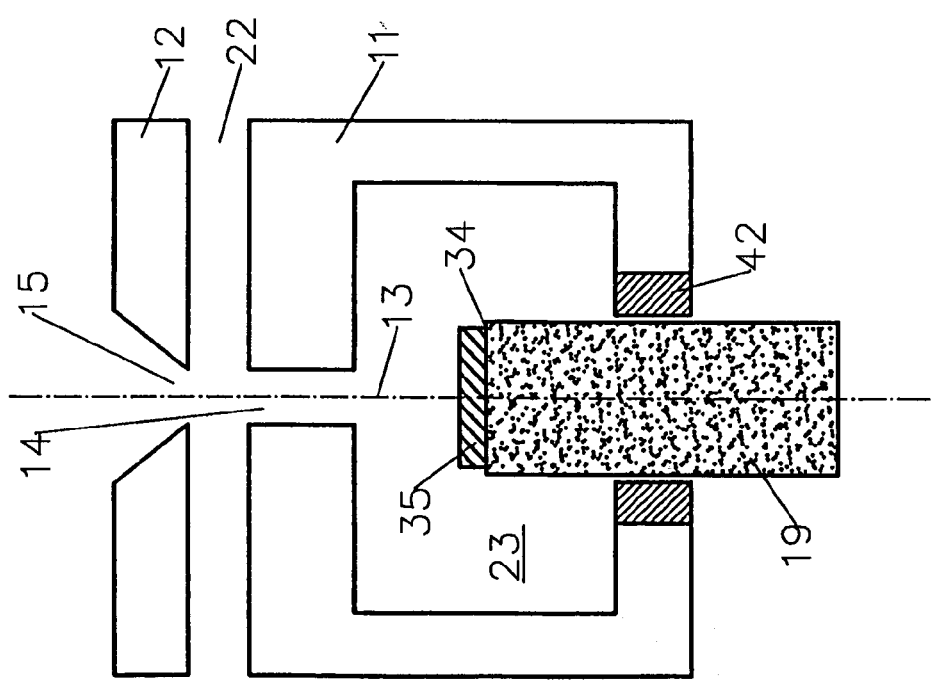
Figure 10:
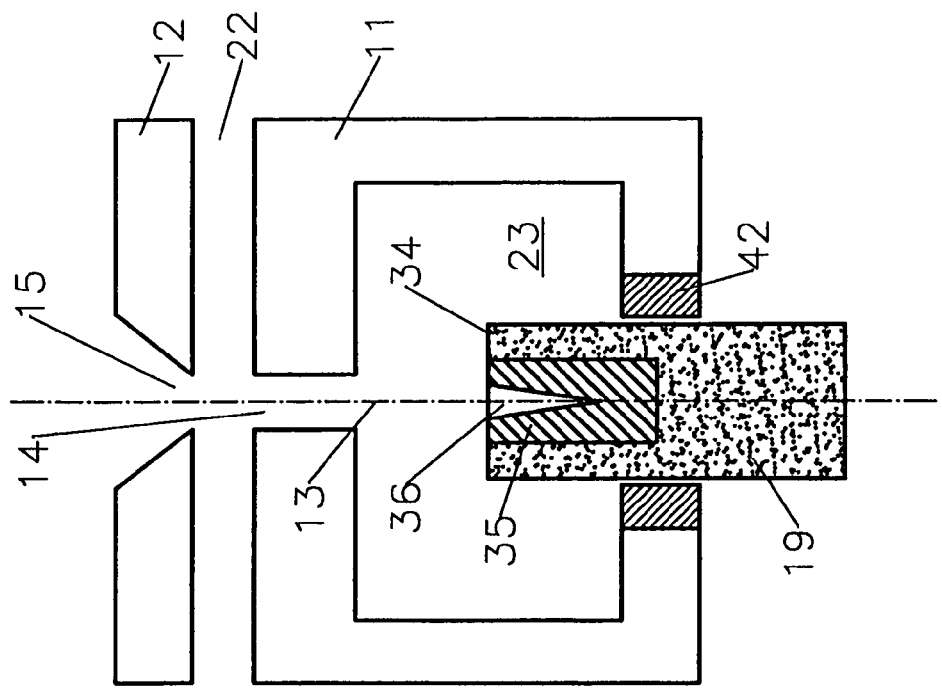
Figure 11:
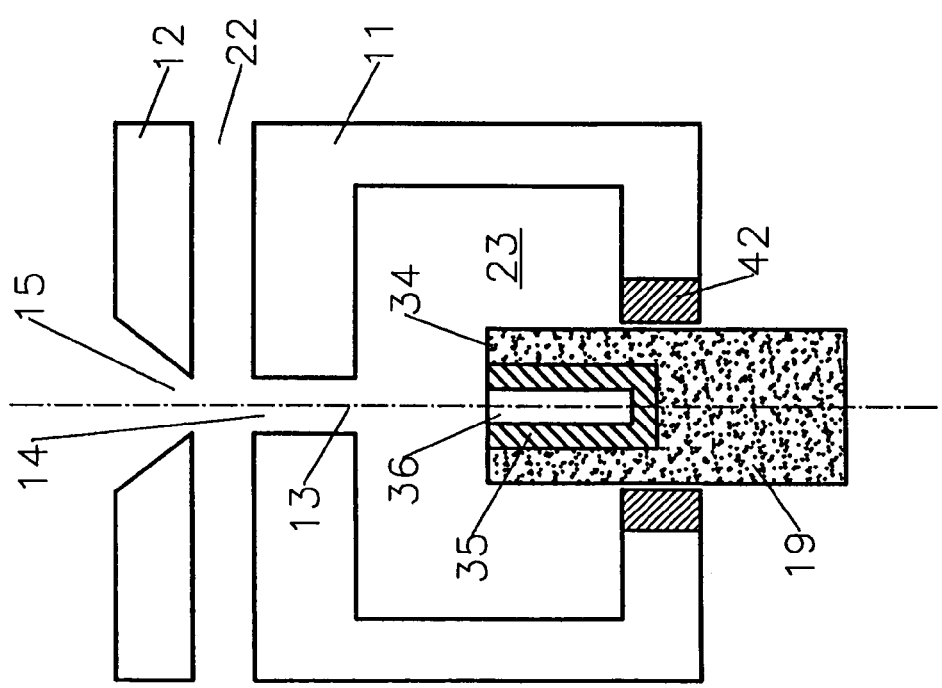

In the case of FIG. 8, the shielding 35 is an insulator in the form of a layer applied to the end face 34 of the triggering electrode 19. In the case of FIG. 9, the shielding 35 is also embodied as an insulator but it is a member that is sunk into the end face 34 of the triggering electrode 39. The cross-section of this member is, for example, of a circular cylindrical shape in order to be inserted in a conventional way into a bore of the triggering electrode 19 which is machined into the end face 34. In FIG. 10 and in FIG. 11 the triggering electrode 19 is identical to that of FIG. 9. However, different shieldings 35 are inserted into its bore. The shielding 35 of FIG. 10 is again a cylindrical member that however has a coaxial recess 36 embodied as a blind bore. The diameter of the blind bore is matched to the diameter of the potential partial stream. The shielding 35 of FIG. 11 is provided with a recess 36 which conically tapers away from the openings 14, 15. A particle beam that is possibly formed impinges on the relatively large surfaces of the shielding 35 so that the beam energy is distributed onto a larger surface area which prevents local thermal heating. In both cases of FIGS. 10, 11, the recesses are suitable to receive the vaporization products caused by an impinging particle beam which particles can deposit on the inner walls of the recesses 36 and therefore do not disturb the other surfaces of the arrangement.

Figure 13:
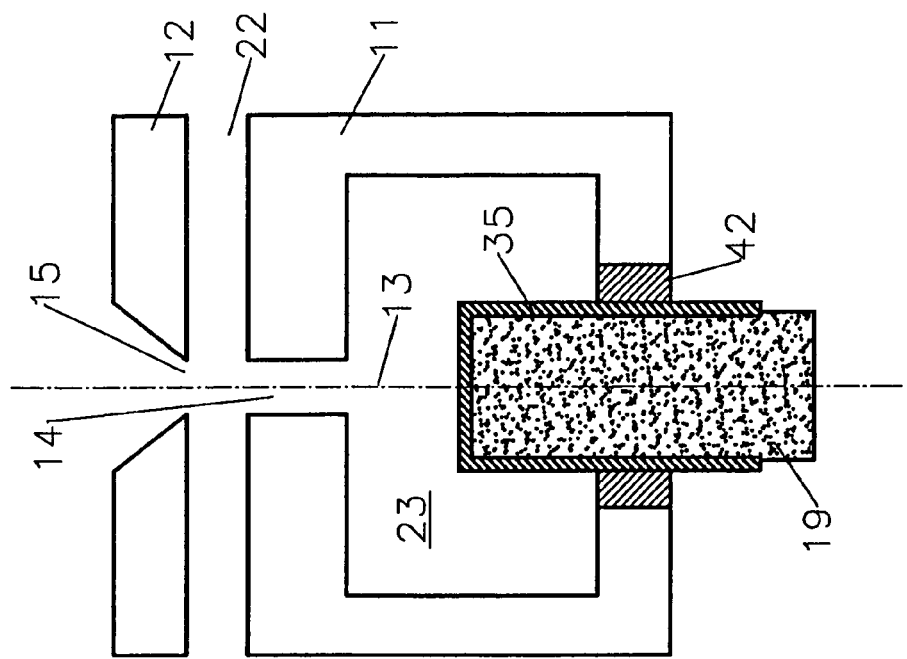
Figure 12:
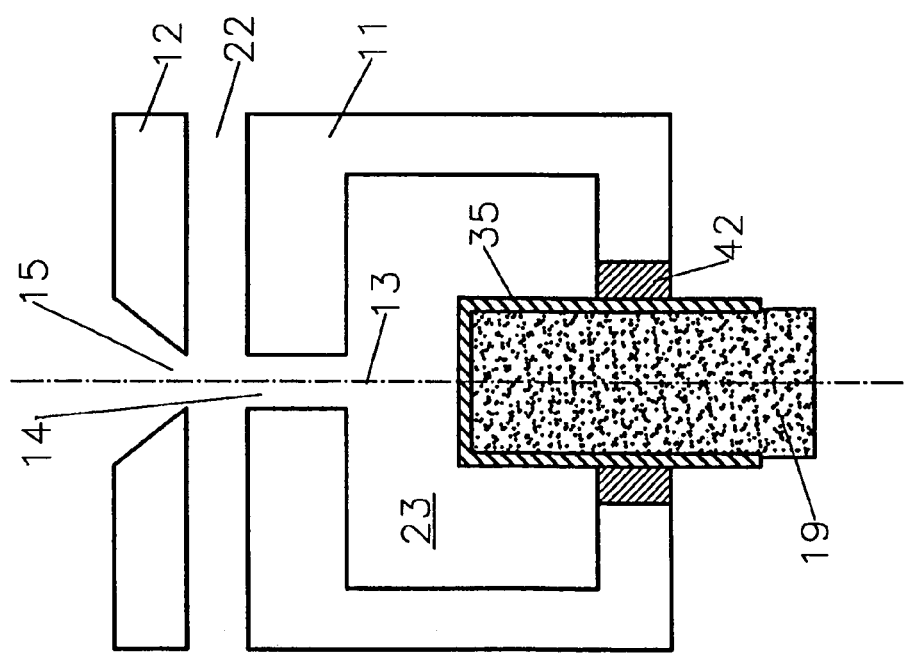

The triggering electrode of FIGS. 12, 13 are characterized in that they are completely insulated by their shielding at least relative to the space 23 adjoining the first electrode 11. The shielding 35 is a coating which does not expose any surface area of the triggering electrode 19. As a result of this, no inhomogeneous electrical fields of any kind can occur which could to be caused by such exposed spaces. Under certain discharge conditions, however, it can occur that on the surface of this shielding 35 electrical charges will collect which can effect shielding of the triggering voltage. A shielding of the triggering voltage would result in a malfunction of the device. Such a shielding action can be prevented when the shielding 35 is provided with a residual conductivity that is large enough to neutralize built-up surface charges or to dissipate them. This residual conductivity is however not large enough to allow current flow between the electrode 12 and the triggering electrode 19 that significantly discharges the capacitor block 21. FIG. 13 shows such a shielding 35 with a suitable residual conductivity.

In all afore described embodiments, the dimensions can be varied within wide limits. For example, the triggering electrode 19 can be configured as a thin wire which is coated expediently according to FIGS. 12, 13.

Figure 15:
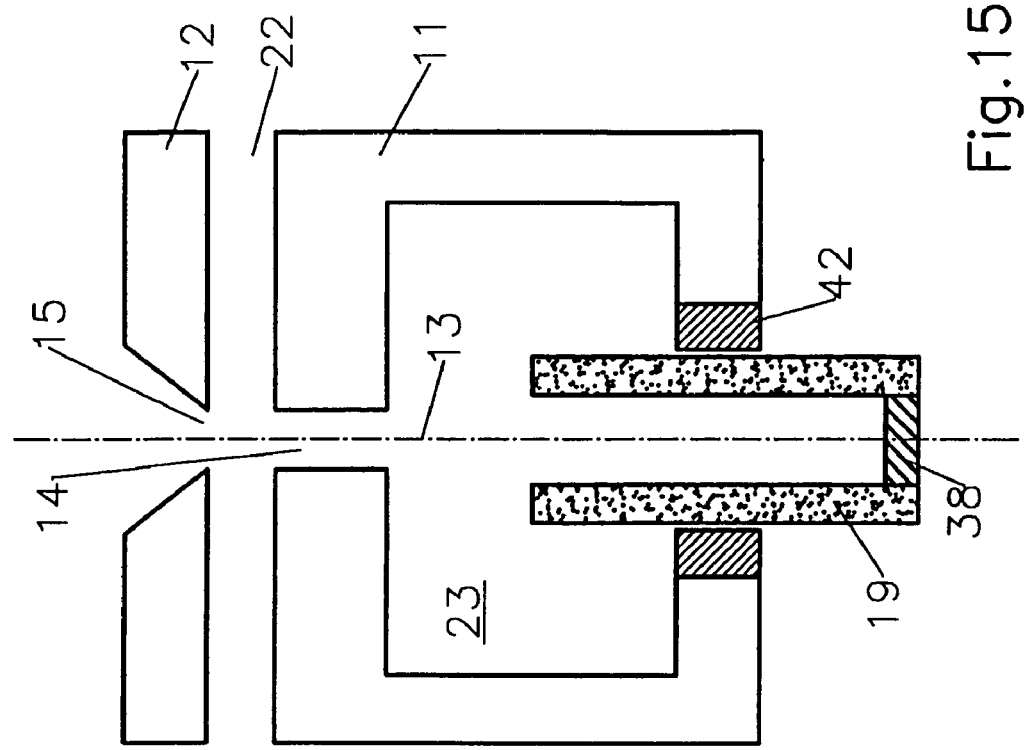
Figure 14:
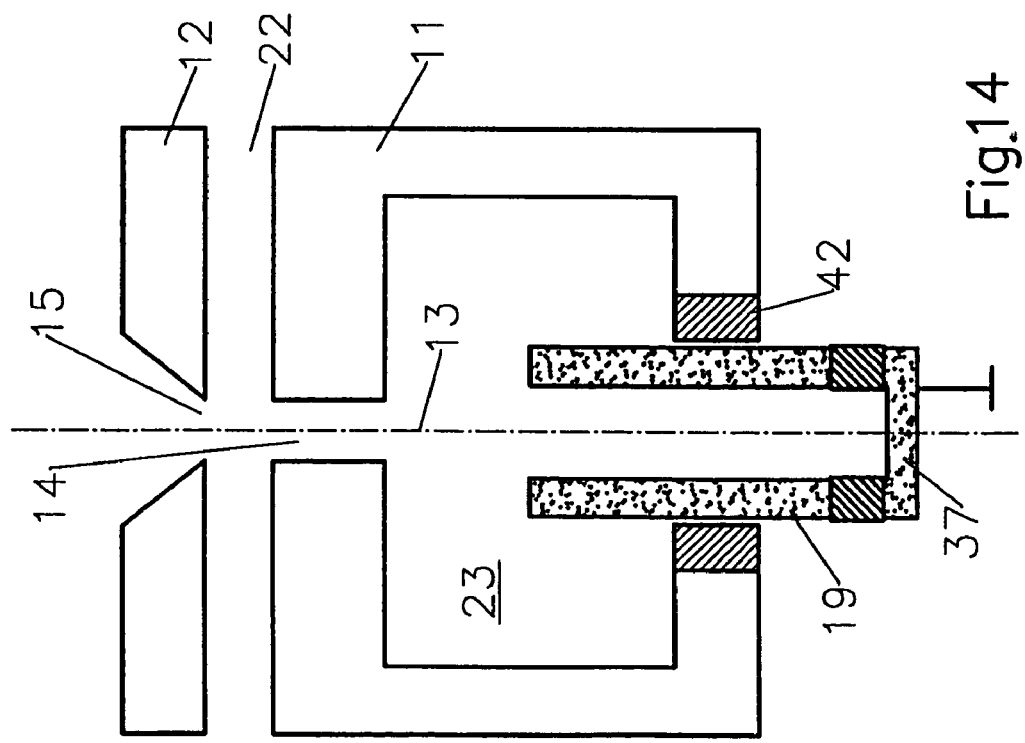
Figure 16:
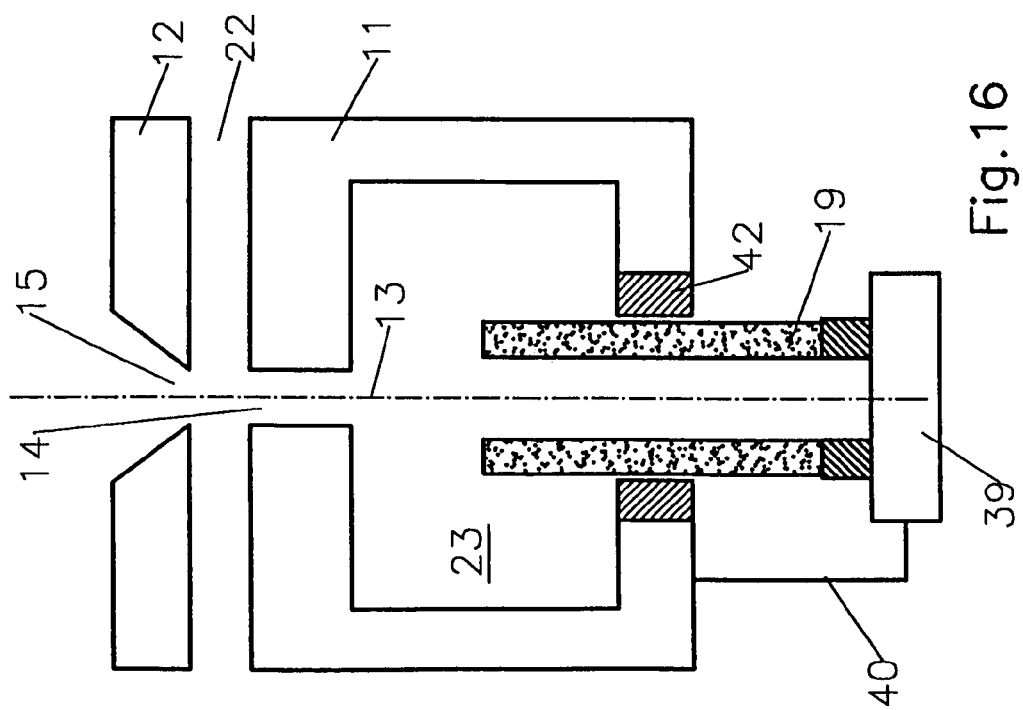

The triggering electrodes 19 of FIGS. 14 to 16 are hollow-cylindrical. These triggering electrodes are arranged coaxially relative to the symmetry axis 13. As a result of their hollow cylindrical embodiment and the field generation, on the other hand, a particle beam formed in the area of the symmetry axis 13 cannot reach the triggering electrode 19 and cannot act thereon in a disturbing or destructive way. In FIG. 14 the triggering electrode 19 is closed off by a metallic bottom 37 that is supplied to ground potential and is insulated relative to the hollow cylindrical triggering electrode 19. Between the bottom 37 and the electrode 12 a particle beam cannot form because this electrode, as an anode, is also connected to ground potential.

FIG. 16 shows a bottom 38 configured as an insulator and therefore has, relative to the particle beam, a similar effect as the shieldings described in connection with FIGS. 8 to 11. In FIG. 16 the bottom 39 of the hollow cylindrical triggering electrode 19 is configured as a mental electrode that is conductingly connected to the electrode 11, the cathode. Charge carriers of particle beams present on the symmetry axis are supplied by means of the metallic bottom 39 by a connecting line 40 to the electrode 12.

Figure 17:
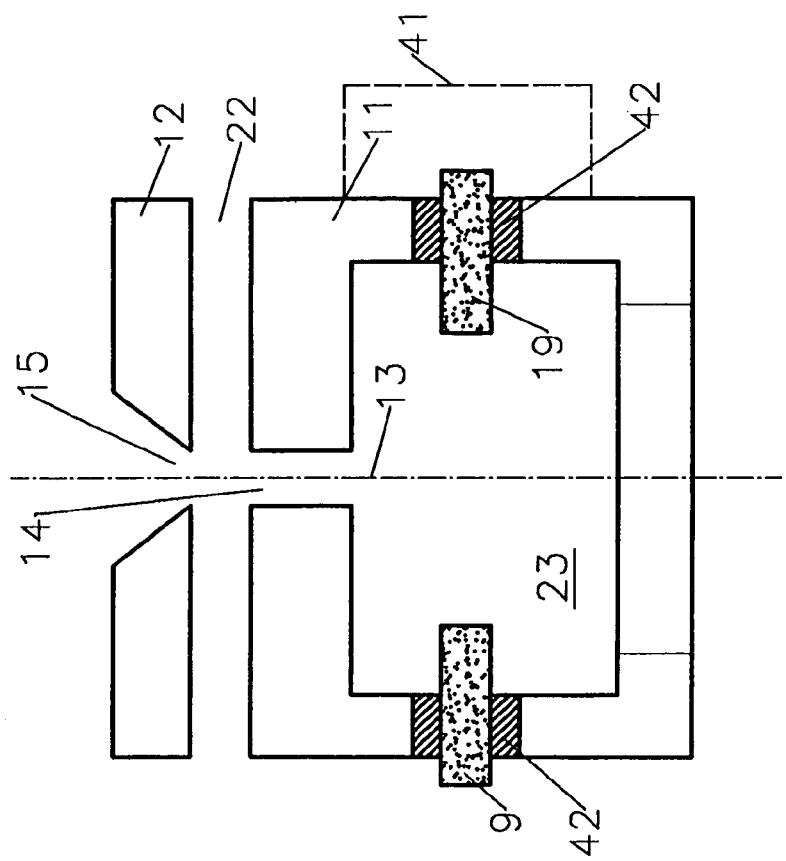
Figure 18:
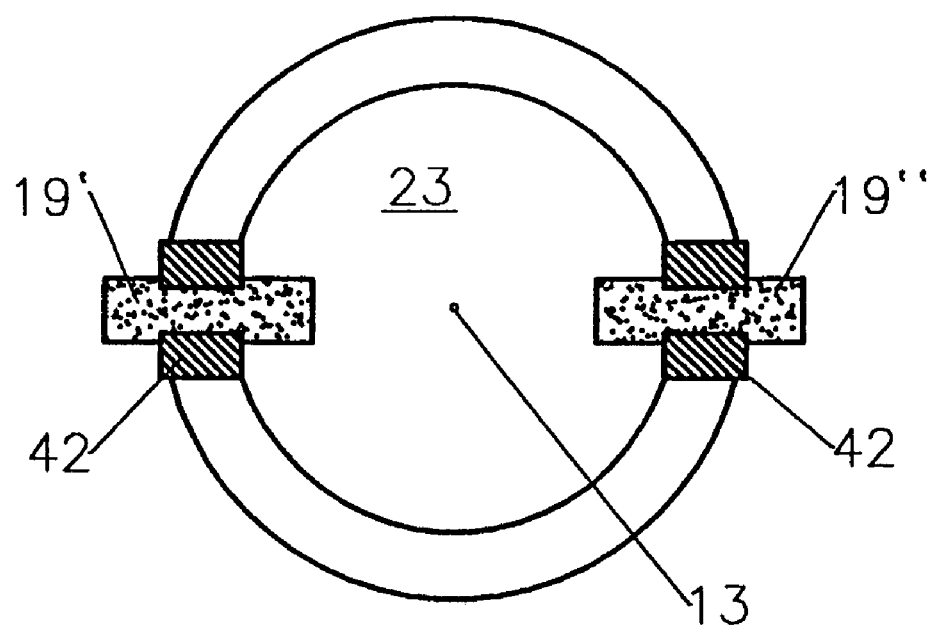

The configurations of FIGS. 17 and 18 are alternative arrangements of FIG. 16. In all cases, charge particles on the symmetry axis 13 or in the space 23 are supplied to the electrode 11. In FIG. 17 the triggering electrode 19 is embodied as an annular plate. This annular plate is mounted transversely to the symmetry axis 13 of the electrode 11, 12 into the first electrode 11. The upper and lower halves thereof, illustrated in FIG. 17, are conductingly connected to by lines 41 illustrated in dashed lines and have thus the same potential. The arrangement of the triggering electrode 19 relative to the symmetry axis 13 is cylinder-symmetrical. This is no longer the case in the situation of FIG. 18. In this embodiment, with the exception of the line 41, the configuration can be the same as in FIG. 17 in a side view. The symmetry axis 13, however, is positioned perpendicularly in FIG. 18 relative to the plane of the illustration, and FIG. 18 shows two identically configured parts 19' and 19" of a triggering electrode that are arranged coaxially and transversely to the symmetry axis 13. The parts 19', 19" represent electrode pins. Instead of the two parts 19, 19' the triggering electrode can also be comprised of several parts.

The shieldings 35 employed in connection with the triggering electrodes 19 are comprised of temperature-resistant insulation materials, for example, $Al_2O_3$, quartz, or silicon carbide. All materials used for the shieldings 35 are connected to the triggering electrode 19 so as to provide excellent thermal conducting.

Moreover, it is understood that the triggering electrode 19 or its parts 19', 19" are mounted in an insulated way in the first electrode 11. The insulations 42 illustrated in FIGS. 8 through 18 fulfill the same functions as the insulator 26 of FIG. 6. The insulation 42 is temperature-resistant, respectively.

The invention claimed is:

1. A device for generating extreme ultraviolet radiation and soft x-ray radiation with a gas discharge operated on the left branch of the Paschen curve, the device comprising:
    a discharge chamber (10) of a predetermined gas pressure;
    two electrodes (11, 12) arranged in the discharge chamber (10), wherein the two electrodes have an opening (14, 15), respectively, wherein the openings have coinciding symmetry axes (13);
    wherein the two electrodes, in the course of a voltage increase (16) upon reaching a predetermined ignition voltage ($U_z$), generate a plasma (17) located in the area between the openings (14, 15);
    a triggering electrode (19) arranged in a space (23) adjoining a first one of the electrodes (11), wherein the triggering electrode triggers an ignition of the plasma (17) for producing the radiation (17') by gas discharge;
    an energy storage device for supplying stored energy into the plasma (17) with the two electrodes (11, 12);
    wherein the triggering electrode (19) is arranged outside of a particle beam being formed on the symmetry axes (13) or is provided with a shielding (35) preventing the particle beam from impinging on the triggering electrode (19).

2. The device according to claim 1, wherein the triggering electrode (19) is arranged on the symmetry axes of the openings (14, 15) of the electrodes (11, 12), wherein the shielding is an insulator provided on an end face (34) of the triggering electrode facing the openings (14, 15) of the electrodes.

3. The device according to claim 2, wherein the insulator is a layer applied onto the end face (34) of the triggering electrode (19).

4. The device according to claim 2, wherein the insulator is a member that is sunk into the end face (34) of the triggering electrode (19).

5. The device according to claim 4, wherein the insulator has a recess (36) with a cross-section matched to the particle beam.

6. The device according to claim 5, wherein the recess (36) of the insulator tapers conically.

7. The device according to claim 1, wherein the triggering electrode (19) is completely insulated at least relative to the space (23) adjoining the first electrode (11).

8. The device according to claim 7, wherein the shielding (35) of the triggering electrode (19) has a residual conductivity that dissipates surface charges but prevents a discharge-affecting current flow between a second one of the two electrodes (12) and the triggering electrode (19).

9. The device according to claim 8, wherein the triggering electrode (19) is formed as a hollow cylinder surrounding the symmetry axes.

10. The device according to claim 9, wherein the triggering electrode (19) has a bottom that is facing away from the two electrodes (11, 12), wherein the bottom is embodied as an insulator or is embodied as a metal bottom connected to the potential of one of the electrodes (11, 12) and insulated relative to a remaining part of the triggering electrode (19).

11. The device according to claim 1, wherein the triggering electrode (19) is an annular plate mounted transversely to the symmetry axis (13) of the electrodes (11, 12) in the first electrode (11) or the triggering electrode is at least one electrode pin mounted transversely to the symmetry axis (13) of the electrodes (11, 12) in the first electrode (11).

12. The device according to claim 1, wherein the triggering electrode (19) is mounted in a first one of the electrodes (11) and is insulated relative to the first electrode.

13. The device according to claim 1, wherein the shielding (35) is comprised of a temperature-resistant insulation material.

14. The device according to claim 1, wherein the shielding (35) is connected to the triggering electrode (19) so as to provide excellent thermal conducting.

15. The device according to claim 1, wherein the shielding (35) has a diameter matching at least a diameter of the openings (14, 15) of the two electrodes.

* * * * *

UNITED STATES PATENT AND TRADEMARK OFFICE
CERTIFICATE OF CORRECTION

PATENT NO.       : 7,126,143 B2
APPLICATION NO.  : 10/474121
DATED            : October 24, 2006
INVENTOR(S)      : Jürgen Klein et al.

It is certified that error appears in the above-identified patent and that said Letters Patent is hereby corrected as shown below:

On the Title page, left column, under the heading "(*) Notice", delete the text (lines 4 and 5) "This patent is subject to a terminal disclaimer."

Signed and Sealed this

Twenty-sixth Day of December, 2006

JON W. DUDAS
*Director of the United States Patent and Trademark Office*